(12) United States Patent
Hirai et al.

(10) Patent No.: US 11,022,853 B2
(45) Date of Patent: Jun. 1, 2021

(54) DISPLAY PANEL

(71) Applicant: Sharp Kabushiki Kaisha, Sakai (JP)

(72) Inventors: Akira Hirai, Sakai (JP); Kiyoshi Minoura, Sakai (JP); Hiromi Matsumoto, Sakai (JP); Akira Sakai, Sakai (JP); Yasuhiro Haseba, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/533,827

(22) Filed: Aug. 7, 2019

(65) Prior Publication Data
US 2020/0064683 A1     Feb. 27, 2020

Related U.S. Application Data

(60) Provisional application No. 62/722,283, filed on Aug. 24, 2018.

(51) Int. Cl.
| | | |
|---|---|---|
| *G02F 1/1368* | (2006.01) | |
| *G02F 1/1335* | (2006.01) | |
| *G02F 1/13357* | (2006.01) | |
| *H01L 27/12* | (2006.01) | |

(52) U.S. Cl.
CPC ...... *G02F 1/1368* (2013.01); *G02F 1/133514* (2013.01); *G02F 1/133602* (2013.01); *H01L 27/1248* (2013.01)

(58) Field of Classification Search
CPC ............. G02F 1/1368; G02F 1/133512; G02F 1/133514; G02F 1/133602
See application file for complete search history.

(56) References Cited

U.S. PATENT DOCUMENTS

| | | | | |
|---|---|---|---|---|
| 2003/0067565 A1* | 4/2003 | Yamamura | ........ | G02F 1/133528 349/65 |
| 2003/0147027 A1* | 8/2003 | Wachi | .................... | G02F 1/1337 349/106 |
| 2011/0212569 A1* | 9/2011 | Yamazaki | ........... | H01L 29/7869 438/104 |
| 2013/0148072 A1* | 6/2013 | Jang | .................... | G02F 1/13452 349/150 |
| 2015/0070612 A1* | 3/2015 | Seo | ..................... | H01L 27/1262 349/43 |

FOREIGN PATENT DOCUMENTS

WO    2016/080385 A1    5/2016

* cited by examiner

*Primary Examiner* — Dung T Nguyen
(74) *Attorney, Agent, or Firm* — Keating & Bennett, LLP

(57) ABSTRACT

The present invention relates to a display panel including on a viewing surface side thereof a thin film transistor substrate. The thin film transistor substrate includes a multilayer film in a region in a plan view including at least one electrode of thin film transistor electrodes including a gate electrode, a source electrode, and a drain electrode. The multilayer film includes a stack including, in the order from the viewing surface side, a first metal layer having a thickness of 40 nm or smaller, a first transparent insulating layer having a thickness of 10 nm or greater and 155 nm or smaller, and a second metal layer having a greater thickness than the first metal layer. The multilayer film includes a layer formed from a metal having a reflectance at a thickness of 200 nm of 50% or lower.

20 Claims, 11 Drawing Sheets

Viewing surface

Viewing surface

DISPLAY PANEL

CROSS-REFERENCE TO RELATED APPLICATIONS

The present application claims priority under 35 U.S.C. § 119 to U.S. Provisional Application No. 62/722,283 filed on Aug. 24, 2018, the contents of which are incorporated herein by reference in their entirety.

BACKGROUND OF THE INVENTION

Field of the Invention

The present invention relates to display panels.

Description of Related Art

Liquid crystal display devices are display devices that use a liquid crystal composition for display. According to a typical display method, light is emitted from a backlight to a liquid crystal panel including a liquid crystal composition enclosed between a pair of substrates, and voltage is applied to the liquid crystal composition to change the alignment of liquid crystal molecules, whereby the amount of light transmitted through the liquid crystal panel is controlled. Such liquid crystal display devices have advantageous features such as thin profile, lightweight, and low power consumption, and are thus used in electronic devices such as smartphones, tablet PCs, and automotive navigation systems.

A conventional liquid crystal panel typically includes on a viewing surface side thereof a color filter substrate and on the backlight side thereof a thin film transistor substrate. Also, liquid crystal panels are known which include on the viewing surface side thereof a thin film transistor substrate and on the backlight side thereof a color filter substrate (e.g., WO 2016/080385).

BRIEF SUMMARY OF THE INVENTION

In the case where a thin film transistor substrate is disposed on the viewing surface side, metal lines are observed when the panel is viewed from the thin film transistor substrate side. These metal lines reflect surrounding light (external light) to increase luminance in a black display state in a bright place, reducing the contrast ratio.

The present invention has been made under the current situation in the art and aims to provide a display panel capable of preventing a reduction in contrast ratio caused by reflection of external light.

(1) An embodiment of the present invention is a display panel including on a viewing surface side thereof a thin film transistor substrate, the thin film transistor substrate including a multilayer film in a region in a plan view including at least one electrode of thin film transistor electrodes including a gate electrode, a source electrode, and a drain electrode, the multilayer film including a stack including, in the order from the viewing surface side, a first metal layer having a thickness of 40 nm or smaller, a first transparent insulating layer having a thickness of 10 nm or greater and 155 nm or smaller, and a second metal layer having a greater thickness than the first metal layer, the multilayer film including a layer formed from a metal having a reflectance at a thickness of 200 nm of 50% or lower.

(2) In an embodiment of the present invention, the display panel includes the structure (1), the multilayer film is disposed closer to the viewing surface than the at least one electrode of the thin film transistor electrodes is, and the thin film transistor substrate includes an insulating layer between the at least one electrode of the thin film transistor electrodes and the multilayer film.

(3) In an embodiment of the present invention, the display panel includes the structure (1) and the second metal layer corresponds to one of the thin film transistor electrodes disposed closest to the viewing surface.

(4) In an embodiment of the present invention, the display panel includes the structure (3), and the second metal layer is disposed in a region including an electrode of the thin film transistor electrodes other than the at least one electrode and is not electrically in contact with the electrode other than the at least one electrode.

(5) In an embodiment of the present invention, the display panel includes the structure (1), (2), (3), or (4), and the first metal layer contains tungsten or titanium.

(6) In an embodiment of the present invention, the display panel includes the structure (1), (2), (3), (4), or (5), and the first transparent insulating layer contains silicon dioxide.

(7) In an embodiment of the present invention, the display panel includes the structure (1), (2), (3), (4), (5), or (6), and the second metal layer contains tungsten or titanium.

(8) In an embodiment of the present invention, the display panel includes the structure (1), (2), (3), (4), (5), (6), or (7), and the first metal layer and the second metal layer contain the same material.

(9) In an embodiment of the present invention, the display panel includes the structure (1), (2), (3), (4), (5), (6), (7), or (8), and the thin film transistor substrate includes a second transparent insulating layer disposed closer to the viewing surface than the first metal layer is.

(10) In an embodiment of the present invention, the display panel includes the structure (9), and the second transparent insulating layer contains silicon nitride.

(11) In an embodiment of the present invention, the display panel includes the structure (1), (2), (3), (4), (5), (6), (7), (8), (9), or (10), and the display panel includes multiple color filters arranged in a plane and a reflective layer disposed between the color filters.

(12) In an embodiment of the present invention, the display panel includes the structure (11), and the display panel includes a first polarizing plate disposed closer to the viewing surface than the reflective layer is, a liquid crystal layer disposed closer to the viewing surface than the first polarizing plate is, and a second polarizing plate disposed closer to the viewing surface than the liquid crystal layer is.

The present invention can provide a display panel capable of preventing a reduction in contrast ratio caused by reflection of external light.

DETAILED DESCRIPTION OF THE INVENTION

Hereinafter, embodiments of the present invention are described. The contents of the following embodiments are not intended to limit the scope of the present invention, and the design may appropriately be changed within the spirit of the configuration of the present invention.

Embodiment 1

Figure 1:
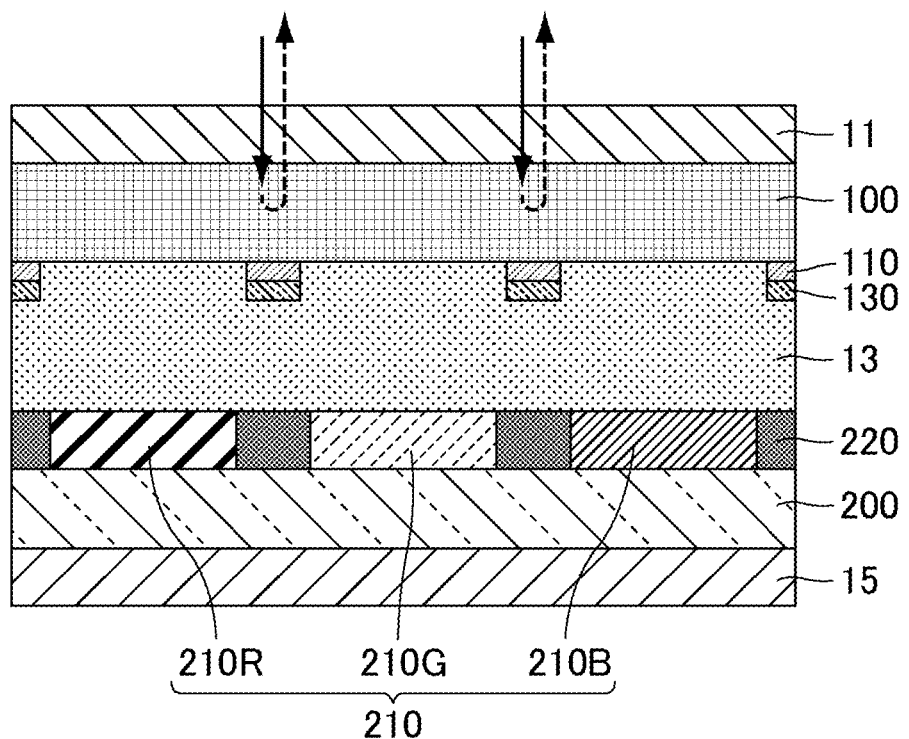
FIG. 1 is a schematic cross-sectional view showing the structure of a liquid crystal panel of Embodiment 1.

FIG. 1 is a schematic cross-sectional view showing the structure of a liquid crystal panel of Embodiment 1. As shown in FIG. 1, the liquid crystal panel of the present embodiment includes, in the order from the viewing surface side, a second polarizing plate 11, a thin film transistor (TFT) substrate, a liquid crystal layer 13, a counter substrate, and a first polarizing plate 15.

The TFT substrate includes a glass substrate (transparent substrate) 100 having on a surface thereof components such as a multilayer film 110, TFT electrodes 130, and pixel electrodes. The TFT electrodes 130 include terminals (gate, source, and drain) of TFTs formed on the TFT substrate and conductive lines electrically connected to the respective terminals, and are formed from a metal or an alloy. In the present embodiment, the TFT substrate serves as one of paired substrates sandwiching the liquid crystal layer 13 and is disposed on the viewing surface side. When the TFT substrate is disposed on the viewing surface side, light incident on the liquid crystal panel from the outside (hereinafter, also referred to as "external light") is reflected by the TFT electrodes 130, which may lower the display quality of the liquid crystal panel. In the present embodiment, the multilayer film 110 is disposed on the viewing surface side of each TFT electrode 130 in order to prevent such reflection of external light by the TFT electrode 130. The solid arrows in FIG. 1 indicate optical paths and directions of external light incident on the TFT electrodes 130. The dotted arrows in FIG. 1 indicate optical paths and directions of external light reflected by the TFT electrodes 130, although the reflection is actually suppressed by the multilayer film 110.

The counter substrate includes a transparent substrate 200 having on the surface thereof components such as a color filter (CF) layer 210, a black matrix layer 220, and a common electrode. The counter substrate may be a color filter substrate typically used in the field of liquid crystal panels. The color filter layer 210 may include color filters of any color. For example, the color filter layer 210 may include red (R) color filters 210R, green (G) color filters 210G, and blue (B) color filters 210B.

The TFT substrate and the counter substrate are bonded together with a sealant disposed around the liquid crystal layer 13 so that the liquid crystal layer 13 is held in a predetermined region. The sealant may be an epoxy resin that contains an inorganic or organic filler and a curing agent.

The polarization axis of the first polarizing plate 15 and the polarization axis of the second polarizing plate 11 may be perpendicular to each other. Each polarization axis may correspond to the absorption axis or the transmission axis of the polarizing plate. Favorable examples for the first polarizing plate 15 and the second polarizing plate 11 include an absorptive polarizing plate obtained by adsorbing a dichroic anisotropic material such as an iodine complex on a polyvinyl alcohol (PVA) film and aligning the material. Typically, each surface of the PVA film is laminated with a protective film such as a triacetyl cellulose film for practical use. An optical film such as a retardation film may be arranged between the first polarizing plate 15 and the counter substrate and between the TFT substrate and the second polarizing plate 11.

Figure 2:
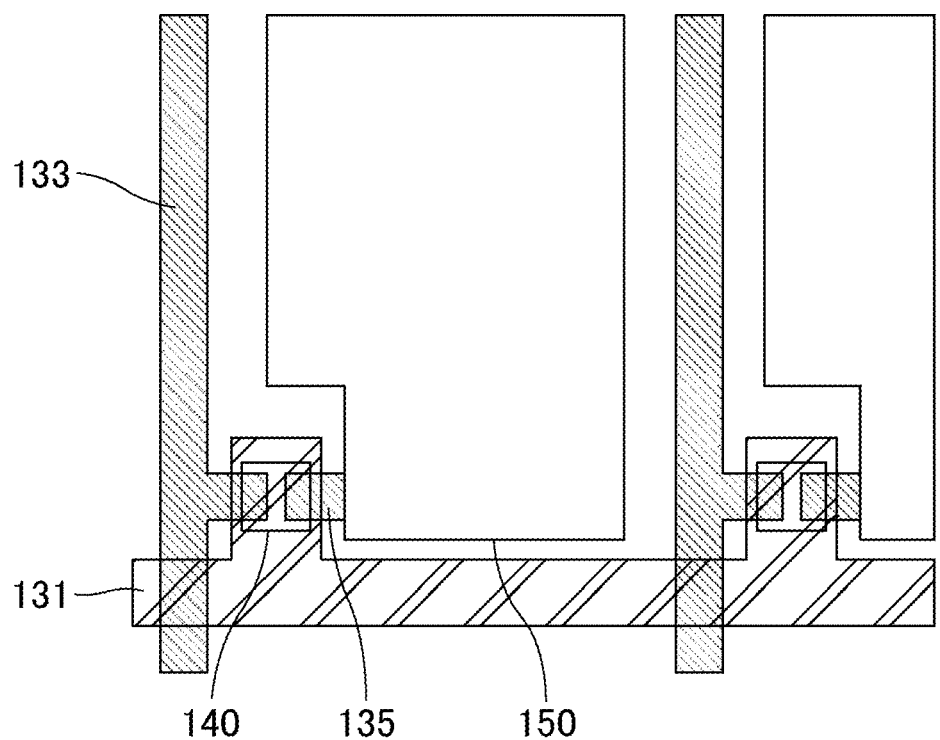
FIG. 2 is an enlarged schematic plan view showing the structure of a pixel in a TFT substrate.

FIG. 2 is an enlarged schematic plan view showing the structure of a pixel in a TFT substrate. The luminance of each pixel in the liquid crystal panel is controlled by the voltage applied to the pixel electrode 150. The pixel electrode 150 is electrically connected to a drain electrode 135. The drain electrode 135 is connected to a source electrode 133 via a semiconductor layer (channel) 140. Current flowing in the semiconductor layer 140 is controlled by the voltage applied to the gate electrode 131. The gate electrode 131, the source electrode 133, and the drain electrode 135 are included in the TFT electrodes 130 shown in FIG. 1.

The semiconductor layer 140 is preferably an oxide semiconductor. The oxide semiconductor may be, for example, a compound (In—Ga—Zn—O) of indium (In), gallium (Ga), zinc (Zn), and oxygen (O), a compound (In-Tin-Zn—O) of indium (In), tin (Tin), zinc (Zn), and oxygen (O), or a compound (In—Al—Zn—O) of indium (In), aluminum (Al), zinc (Zn), and oxygen (O).

The pixel electrode 150 may be a transparent electrode made of, for example, a transparent conductive material such as indium tin oxide (ITO), indium zinc oxide (IZO), zinc oxide (ZnO), or tin oxide (SnO), or an alloy thereof.

Figure 3:
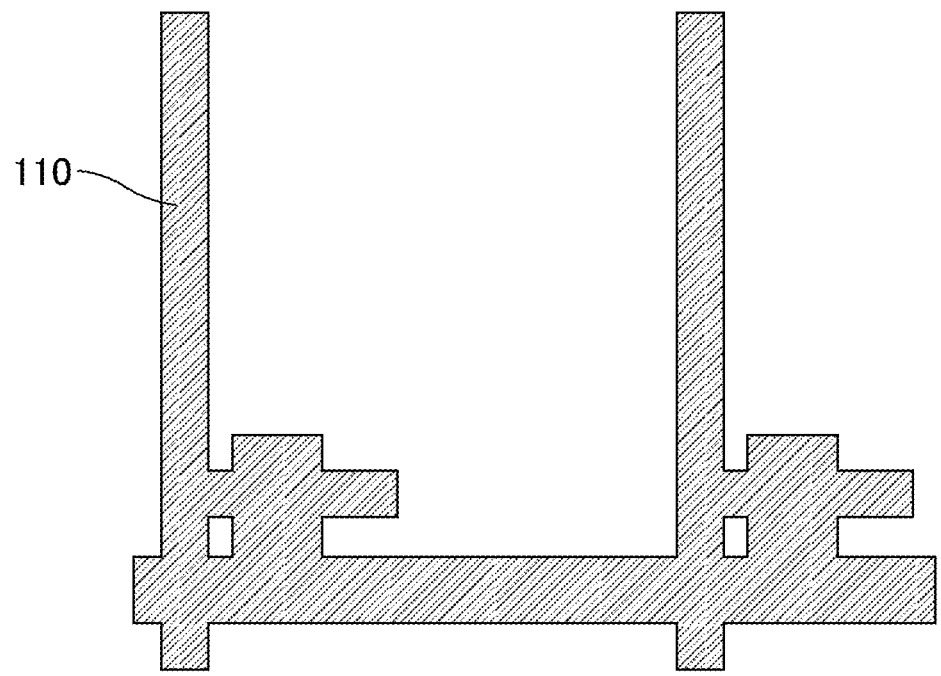
FIG. 3 is a schematic plan view showing the structure of a multilayer film 110 in Embodiment 1.

FIG. 3 is a schematic plan view showing the structure of the multilayer film 110 in Embodiment 1. As shown in FIG. 3, the multilayer film 110 is disposed so as to include the regions corresponding to the gate electrode 131, the source electrode 133, and the drain electrode 135. Thereby, reflection of external light by the gate electrode 131, the source electrode 133, and the drain electrode 135 can be suppressed.

Figure 4:
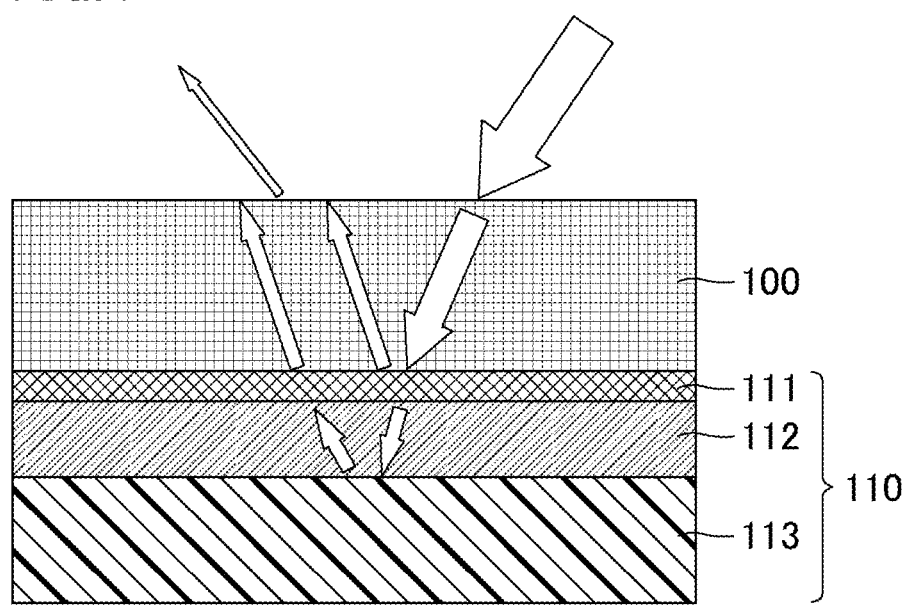
FIG. 4 is a schematic cross-sectional view illustrating the principle of prevention of reflection achieved by the multilayer film 110.

FIG. 4 is a schematic cross-sectional view illustrating the principle of prevention of reflection achieved by the multilayer film 110. The multilayer film 110 is disposed closer to the glass substrate 100 (viewing surface) than the TFT electrode 130 is, in order to reduce light reflected on the surface of the TFT electrode 130. The multilayer film 110 includes a stack including, in the order from the viewing surface side, a first metal layer 111 having a thickness of 40 nm or smaller, a first transparent insulating layer 112 having a thickness of 10 nm or greater and 155 nm or smaller, and a second metal layer 113 having a greater thickness than the first metal layer 111. The structure of the multilayer film 110 causes multiple reflection in the interface between the glass substrate 100 and the multilayer film 110 and in the interfaces within the multilayer film 110 to reduce the amount of reflected light utilizing interference of the reflected light components. Specifically, light reflected by the first metal layer 111 and light having passed through the first metal layer 111 and the first transparent insulating layer 112 and then reflected by the second metal layer 113 interfere each other and thereby attenuate each other, resulting in suppression of reflection of light. This mechanism can improve the contrast ratio of liquid crystal display in a bright place.

The multilayer film 110 includes a layer formed from a metal having a reflectance at a thickness of 200 nm of 50% or lower. Such a multilayer film 110 can enhance the antireflection effect. The "metal having a reflectance at a thickness of 200 nm of 50% or lower" may be an alloy. Table 1 shows the reflectance values at a thickness of 200 nm of metals.

TABLE 1

| Kind of metal | Reflectance |
| --- | --- |
| Ag | 94% |
| Al | 88% |
| Mo | 43% |
| Ti | 38% |
| W | 35% |
| TaN | 35% |
| Ta | 23% |

As shown in Table 1, examples of the metal having a reflectance at a thickness of 200 nm of 50% or lower include Mo, Ti, W, TaN, and Ta, Ag and Al each have a reflectance much greater than 50%. These metals have a higher reflectance than other metals even when formed into a thin film, which may exessively increase the amount of light reflected by the multilayer film 110.

The second metal layer 113 preferably transmits no light and thus is preferred to have a thickness of 100 nm or greater. The second metal layer 113 may be a stack including two or more kinds of metals.

Figure 5:
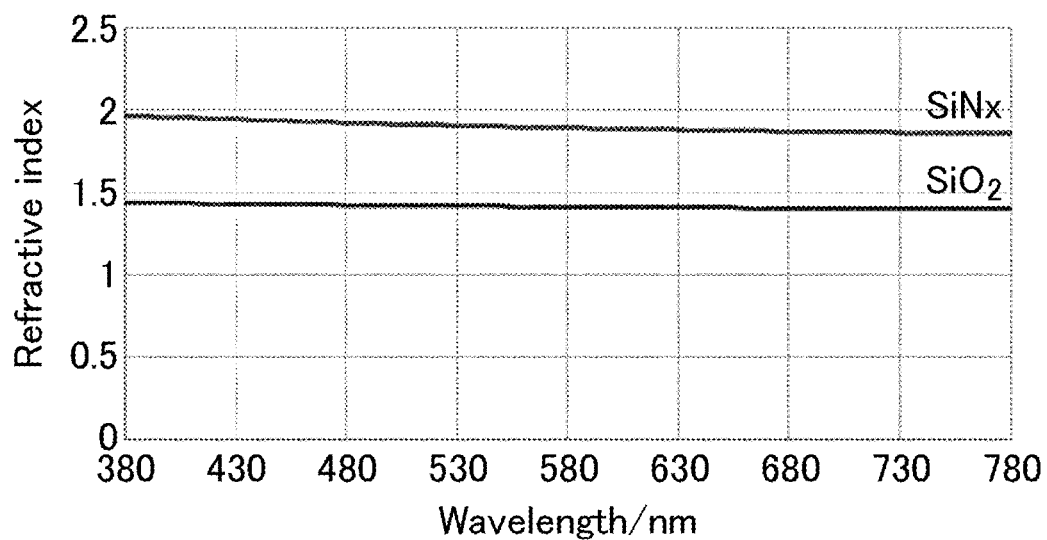
FIG. 5 is a graph showing the wavelength dependence of the refractive index of $SiO_2$ and of SiNx.

The interfering light attenuates using the optical path length in the first transparent insulating layer 112 between the first metal layer 111 and the second metal layer 113. The attenuation of the interfering light thus depends on the wavelength. Accordingly, the first transparent insulating layer 112 is preferably formed from a material showing a constant refractive index at any wavelength (a material having a refractive index showing less wavelength dependence), and examples of such a material include silicon dioxide ($SiO_2$) and silicon nitride ($SiN_x$). FIG. 5 is a graph showing the wavelength dependence of the refractive index of $SiO_2$ and of $SiN_x$.

Figure 6:
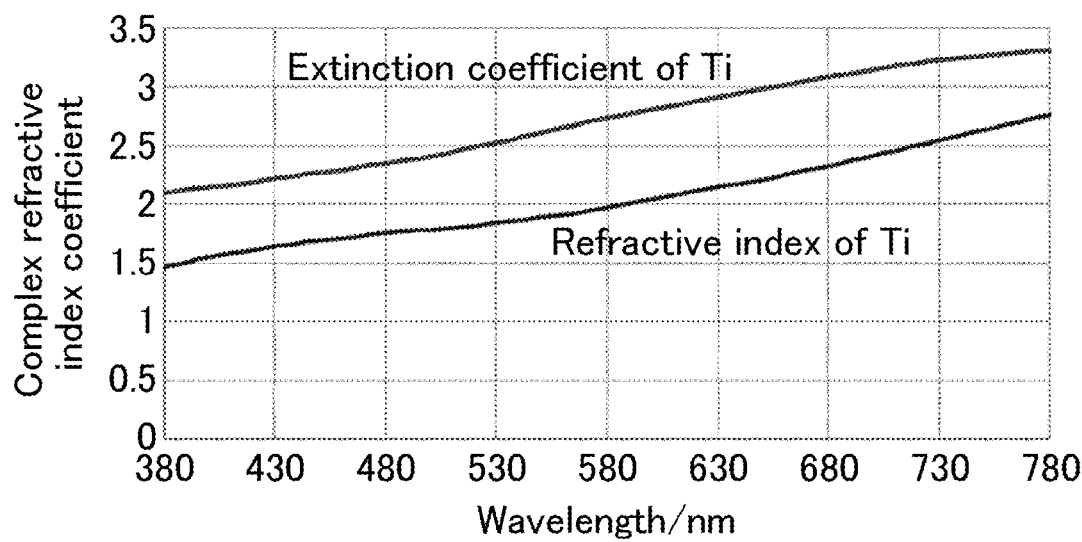
FIG. 6 is a graph showing the wavelength dependence of the complex refractive index of titanium (Ti).
Figure 7:
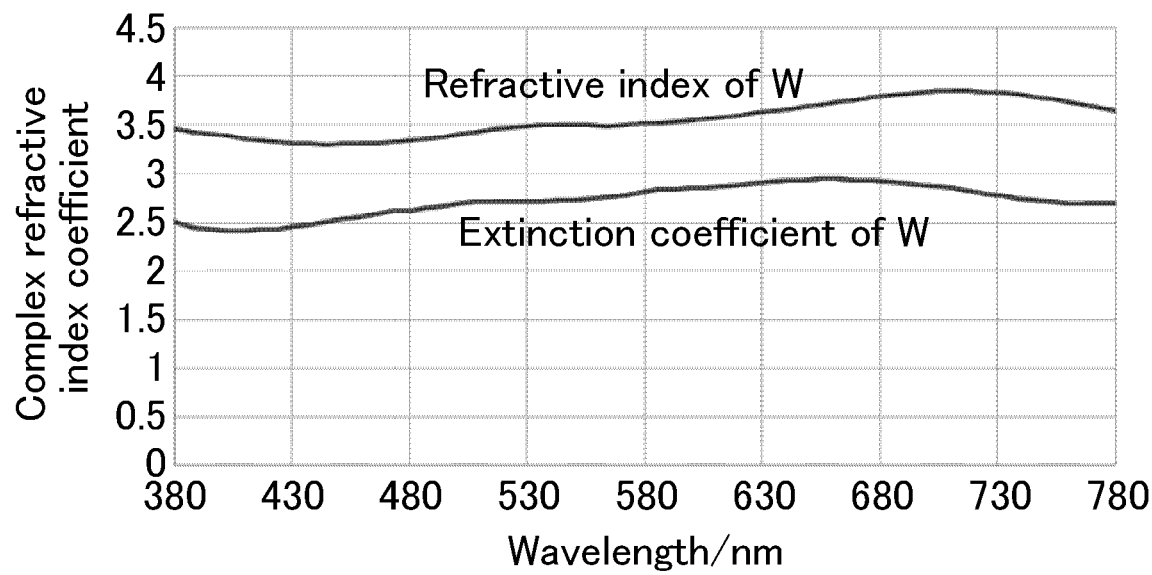
FIG. 7 is a graph showing the wavelength dependence of the complex refractive index of tungsten (W).

In the first metal layer 111 and the second metal layer 113, preferably, the real part (refractive index) and the imaginary part (extinction coefficient) of the complex refractive index show similar tendencies against the wavelength dependence (e.g., the real part and the imaginary part increase as the wavelength is longer). The wavelength dependence of the complex refractive index of each metal layer is more preferred to be small (flat). Favorable examples of the material for the metal layers include titanium (Ti) and tungsten (W). FIG. 6 is a graph showing the wavelength dependence of the complex refractive index of titanium (Ti). FIG. 7 is a graph showing the wavelength dependence of the complex refractive index of tungsten (W). The first metal layer 111 and the second metal layer 113 preferably include the same material in order to achieve the same wavelength dependence.

The multilayer films 110 may be disposed closer to the viewing surface than the corresponding thin film transistor electrodes are, the thin film transistor electrodes including the gate electrode 131, the source electrode 133, and the drain electrode 135. In this case, an insulating layer is disposed between the thin film transistor electrode and the multilayer film 110. The insulating layer can prevent current leakage between the second metal layer 113 in the multilayer film 110 and the thin film transistor electrodes.

The multilayer film 110 may include part of the thin film transistor electrodes, including the gate electrode 131, the source electrode 133, and the drain electrode 135. For example, the second metal layer 113 may correspond to one of the thin film transistor electrodes disposed closest to the viewing surface. In this case, preferably, the second metal layer 113 is disposed in a region including an electrode of the thin film transistor electrodes other than the at least one electrode and is not electrically in contact with the electrode other than the at least one electrode. For example, preferably, when the gate electrode 131 functions as the second metal layer 113 in the multilayer film 110, the multilayer film 110 is disposed in a region including the source electrode 133 and the drain electrode 135, and the gate electrode 131 is not electrically in contact with the source electrode 133 and the drain electrode 135.

The TFT substrate may include the second transparent insulating layer disposed closer to the viewing surface than the first metal layer 111 is. Examples of the second transparent insulating layer include a layer including silicon nitride.

The liquid crystal panel of Embodiment 1 may include a reflective layer between multiple color filters arranged in a plane. Disposing a reflective layer between the color filters can reflect light that is emitted from the backlight and is incident on the region not for display (region with the black matrix layer 220) to the backlight side, which achieves more efficient use of light. A favorable example of the reflective layer is an aluminum (Al) layer.

When the reflective layer is disposed, the first polarizing plate 15 located at the backlight side is preferably disposed closer to the viewing surface than the reflective layer is. This enables the structure in which light reflected by the reflective layer does not pass through the first polarizing plate 15, to achieve more efficient use of light. In terms of providing liquid crystal display, the first polarizing plate 15 is disposed closer to the back surface than the liquid crystal layer 13 is.

The liquid crystal panel of Embodiment 1 is a component of a liquid crystal display device. The liquid crystal display device includes, in addition to a liquid crystal panel, components including a backlight; an optical film such as a viewing angle increase film or a luminance improvement film; an external circuit such as a tape carrier package (TCP) or a printed-circuit board (PCB); and a bezel (frame). In addition to the described components, any component typically used in the field of liquid crystal display devices may be used, description of which is omitted.

Although Embodiment 1 exemplifies a liquid crystal panel, the display panel of the present invention may be any panel that includes a TFT substrate on the viewing surface side and may be, for example, an organic EL panel. In order to achieve effects of the present invention, every component disposed closer to the viewing surface than the TFT substrate is has a light transmittance of preferably 50% or lower.

Although Embodiment 1 exemplifies the multilayer film 110 superimposed with the gate electrode 131, the source electrode 133, and the drain electrode 135, the multilayer film 110 may be superimposed with at least one of the gate electrode 131, the source electrode 133, or the drain electrode 135. This structure allows the multilayer film to achieve an effect of suppressing reflection of external light by the superimposed electrode.

Although Embodiment 1 exemplifies the counter substrate provided with the color filter layer 210 and the black matrix layer 220, at least one of the color filter layer 210 or the black matrix layer 220 may be disposed on the TFT substrate.

Hereinafter, the present invention will be described in more detail with reference to examples and comparative examples, but the present invention is not limited to only these examples.

Example 1-1

Figure 8:
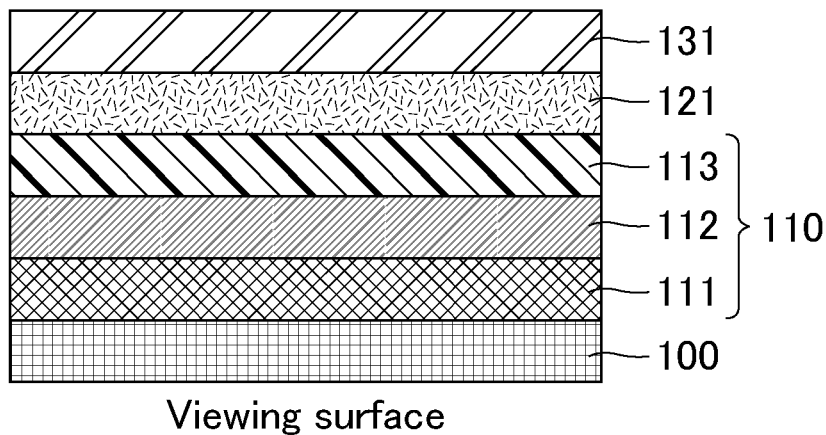
FIG. 8 is a schematic cross-sectional view showing the structure of a multilayer film in Example 1-1.

FIG. 8 is a schematic cross-sectional view showing the structure of a multilayer film of Example 1-1. In Example 1-1, a first metal layer (metal layer A) 111, a first transparent insulating layer (transparent insulating layer B) 112, a second metal layer (metal layer C) 113, an insulating layer 121, a gate electrode 131, a gate insulating layer, a semiconductor layer, and a source-drain electrode were formed in the stated order on the glass substrate 100, whereby a TFT substrate was produced. The multilayer film 110 of Example 1-1 consists of the first metal layer (metal layer A) 111, the first transparent insulating layer (transparent insulating layer B) 112, and the second metal layer (metal layer C) 113. The multilayer film 110 and the TFT electrodes 130 of Example 1-1 had the same plane shapes as those shown in FIGS. 2 and 3. Table 2 shows the materials and the thicknesses of the first metal layer (metal layer A) 111, the first transparent insulating layer (transparent insulating layer B) 112, and the second metal layer (metal layer C) 113.

The resulting TFT substrate was bonded with a counter substrate to which liquid crystals have been added dropwise. Then, two polarizing plates were attached on the viewing surface side of the TFT substrate and on the back surface side of the counter substrate such that their transmission axes were arranged in the crossed Nicols, whereby a liquid crystal panel was produced. A backlight was disposed on the back surface side of the liquid crystal panel, whereby a liquid crystal display device was produced.

The resulting liquid crystal display device was measured for the luminance in white display and the luminance in black display under an environment at about 200 1x using a spectroradiometer "SR-UL2" available from Topcon Technohouse Corporation. The measurement results were substituted into the following formula to provide the contrast ratio.

(Contrast ratio)=(Luminance in white display)÷(Luminance in black display)

Examples 1-2 to 1-9 and Comparative Examples 1-1 to 1-2

Liquid crystal display devices were produced in the same manner as in Example 1-1 except that the first metal layer (metal layer A) 111, the first transparent insulating layer (transparent insulating layer B) 112, and the second metal layer (metal layer C) 113 had different materials and thicknesses. Each device was determined for the contrast ratio. Table 2 shows the results.

TABLE 2

| | Metal layer A | | Transparent insulating layer B | | Metal layer C | | |
|---|---|---|---|---|---|---|---|
| | Kind | Thickness | Kind | Thickness | Kind | Thickness | CR |
| Example 1-1 | Ti | 1 nm | SiO$_2$ | 100 nm | Ti | 100 nm | 90 |
| Example 1-2 | Ti | 5 nm | SiO$_2$ | 100 nm | Ti | 100 nm | 230 |
| Example 1-3 | Ti | 10 nm | SiO$_2$ | 100 nm | Ti | 100 nm | 390 |
| Example 1-4 | Ti | 15 nm | SiO$_2$ | 100 nm | Ti | 100 nm | 280 |
| Example 1-5 | Ti | 20 nm | SiO$_2$ | 100 nm | Ti | 100 nm | 190 |
| Example 1-6 | Ti | 25 nm | SiO$_2$ | 100 nm | Ti | 100 nm | 140 |
| Example 1-7 | Ti | 30 nm | SiO$_2$ | 100 nm | Ti | 100 nm | 110 |
| Example 1-8 | Ti | 35 nm | SiO$_2$ | 100 nm | Ti | 100 nm | 100 |
| Example 1-9 | Ti | 40 nm | SiO$_2$ | 100 nm | Ti | 100 nm | 90 |
| Comparative Example 1-1 | Ti | 45 nm | SiO$_2$ | 100 nm | Ti | 100 nm | 80 |
| Comparative Example 1-2 | — | 0 nm | — | 0 nm | Ti | 100 nm | 80 |

Table 2 shows that Examples 1-1 to 1-9, in which the first metal layer had a thickness of 40 nm or smaller, achieved higher contrast ratios than Comparative Examples 1-1 and 1-2. The luminance measurement performed in a bright place caused Comparative Examples 1-1 and 1-2 to give reduced contrast ratios due to reflection of surrounding light and Examples 1-1 to 1-9 to give increased contrast ratios due to a reduction in reflection of surrounding light.

Examples 2-1 to 2-8 and Comparative Examples 2-1 to 2-2

Liquid crystal display devices were produced in the same manner as in Example 1-1 except that the first metal layer (metal layer A) 111, the first transparent insulating layer (transparent insulating layer B) 112, and the second metal layer (metal layer C) 113 had different materials and thicknesses. Each device was determined for the contrast ratio. Table 3 shows the results.

TABLE 3

| | Metal layer A | | Transparent insulating layer B | | Metal layer C | | |
|---|---|---|---|---|---|---|---|
| | Kind | Thickness | Kind | Thickness | Kind | Thickness | CR |
| Comparative Example 2-1 | Ti | 10 nm | SiO$_2$ | 5 nm | Ti | 100 nm | 80 |
| Example 2-1 | Ti | 10 nm | SiO$_2$ | 10 nm | Ti | 100 nm | 100 |
| Example 2-2 | Ti | 10 nm | SiO$_2$ | 30 nm | Ti | 100 nm | 120 |
| Example 2-3 | Ti | 10 nm | SiO$_2$ | 50 nm | Ti | 100 nm | 190 |
| Example 2-4 | Ti | 10 nm | SiO$_2$ | 80 nm | Ti | 100 nm | 350 |
| Example 2-5 | Ti | 10 nm | SiO$_2$ | 100 nm | Ti | 100 nm | 390 |
| Example 2-6 | Ti | 10 nm | SiO$_2$ | 120 nm | Ti | 100 nm | 240 |
| Example 2-7 | Ti | 10 nm | SiO$_2$ | 140 nm | Ti | 100 nm | 130 |
| Example 2-8 | Ti | 10 nm | SiO$_2$ | 155 nm | Ti | 100 nm | 90 |

TABLE 3-continued

| | Metal layer A | | Transparent insulating layer B | | Metal layer C | | |
|---|---|---|---|---|---|---|---|
| | Kind | Thickness | Kind | Thickness | Kind | Thickness | CR |
| Comparative Example 2-2 | Ti | 10 nm | SiO$_2$ | 160 nm | Ti | 100 nm | 80 |
| Comparative Example 1-2 | — | 0 nm | — | 0 nm | Ti | 100 nm | 80 |

Table 3 shows that Examples 2-1 to 2-8, in which the first transparent insulating layer had a thickness of 10 nm or greater and 155 nm or smaller, achieved higher contrast ratios than Comparative Examples 1-2 and 2-1 to 2-2.

Examples 3-1 to 3-6 and Comparative Example 3-1)

Liquid crystal display devices were produced in the same manner as in Example 1-1 except that the first metal layer (metal layer A) 111, the first transparent insulating layer (transparent insulating layer B) 112, and the second metal layer (metal layer C) 113 had different materials and thicknesses. Each device was determined for the contrast ratio. Table 4 shows the results.

TABLE 4

| | Metal layer A | | Transparent insulating layer B | | Metal layer C | | |
|---|---|---|---|---|---|---|---|
| | Kind | Thickness | Kind | Thickness | Kind | Thickness | CR |
| Example 3-1 | W | 1 nm | SiO$_2$ | 80 nm | W | 100 nm | 120 |
| Example 3-2 | W | 5 nm | SiO$_2$ | 80 nm | W | 100 nm | 410 |
| Example 3-3 | W | 10 nm | SiO$_2$ | 80 nm | W | 100 nm | 230 |
| Example 3-4 | W | 15 nm | SiO$_2$ | 80 nm | W | 100 nm | 140 |
| Example 3-5 | W | 20 nm | SiO$_2$ | 80 nm | W | 100 nm | 100 |
| Example 3-6 | W | 25 nm | SiO$_2$ | 80 nm | W | 100 nm | 90 |
| Comparative Example 3-1 | — | 0 nm | — | 0 nm | W | 100 nm | 80 |

Table 4 shows that Examples 3-1 to 3-6 achieved higher contrast ratios than Comparative Example 3-1.

Examples 4-1 to 4-7 and Comparative Example 4-1

Liquid crystal display devices were produced in the same manner as in Example 1-1 except that the first metal layer (metal layer A) 111, the first transparent insulating layer (transparent insulating layer B) 112, and the second metal layer (metal layer C) 113 had different materials and thicknesses. Each device was determined for the contrast ratio. Table 5 shows the results.

TABLE 5

| | Metal layer A | | Transparent insulating layer B | | Metal layer C | | |
|---|---|---|---|---|---|---|---|
| | Kind | Thickness | Kind | Thickness | Kind | Thickness | CR |
| Comparative Example 4-1 | W | 5 nm | SiNx | 1 nm | W | 100 nm | 80 |
| Example 4-1 | W | 5 nm | SiNx | 10 nm | W | 100 nm | 100 |
| Example 4-2 | W | 5 nm | SiNx | 20 nm | W | 100 nm | 140 |
| Example 4-3 | W | 5 nm | SiNx | 30 nm | W | 100 nm | 200 |
| Example 4-4 | W | 5 nm | SiNx | 50 nm | W | 100 nm | 380 |
| Example 4-5 | W | 5 nm | SiNx | 70 nm | W | 100 nm | 290 |
| Example 4-6 | W | 5 nm | SiNx | 100 nm | W | 100 nm | 110 |
| Example 4-7 | W | 5 nm | SiNx | 110 nm | W | 100 nm | 110 |
| Comparative Example 3-1 | — | 0 nm | — | 0 nm | W | 100 nm | 80 |

Table 5 shows that Examples 4-1 to 4-8 achieved higher contrast ratios than Comparative Examples 3-1 and 4-1.

Example 5-1

Figure 9:
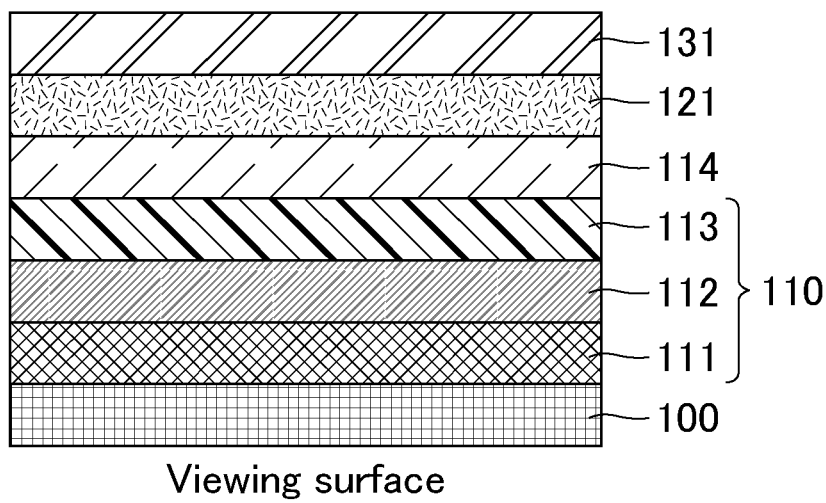
FIG. 9 is a schematic cross-sectional view showing the structure of a multilayer film in Example 5-1.

FIG. 9 is a schematic cross-sectional view showing the structure of a multilayer film of Example 5-1. In Example 5-1, the first metal layer (metal layer A) 111, the first transparent insulating layer (transparent insulating layer B) 112, the second metal layer (metal layer C) 113, the second metal layer (metal layer D) 114, the insulating layer 121, the gate electrode 131, a gate insulating layer, a semiconductor layer, and a source-drain electrode were formed in the stated order on the glass substrate 100, whereby a TFT substrate was produced. Then, a liquid crystal display device was produced in the same manner as in Example 1-1, and the contrast ratio was calculated.

The multilayer film 110 of Example 5-1 consists of the first metal layer (metal layer A) 111, the first transparent insulating layer (transparent insulating layer B) 112, the second metal layer (metal layer C) 113, and the second metal layer (metal layer D) 114. The multilayer film 110 and the TFT electrodes 130 of Example 5-1 had the same plane shapes as those shown in FIGS. 2 and 3. Table 6 shows the materials and the thicknesses of the first metal layer (metal layer A) 111, the first transparent insulating layer (transparent insulating layer B) 112, the second metal layer (metal layer C) 113, and the second metal layer (metal layer D) 114.

Examples 5-2 to 5-9 and Comparative Examples 5-1 to 5-2

Liquid crystal display devices were produced in the same manner as in Example 5-1 except that the first metal layer (metal layer A) 111, the first transparent insulating layer (transparent insulating layer B) 112, the second metal layer (metal layer C) 113, and the second metal layer (metal layer D) 114 had different materials and thicknesses. Each device was determined for the contrast ratio. Table 6 shows the results.

TABLE 6

| | Metal layer A | | Transparent insulating layer B | | Metal layer C | | Metal layer D | | |
|---|---|---|---|---|---|---|---|---|---|
| | Kind | Thickness | Kind | Thickness | Kind | Thickness | Kind | Thickness | CR |
| Example 5-1 | W | 10 nm | SiO$_2$ | 80 nm | W | 100 nm | Al | 100 nm | 140 |
| Example 5-2 | W | 10 nm | SiO$_2$ | 80 nm | W | 90 nm | Al | 100 nm | 140 |
| Example 5-3 | W | 10 nm | SiO$_2$ | 80 nm | W | 80 nm | Al | 100 nm | 140 |
| Example 5-4 | W | 10 nm | SiO$_2$ | 80 nm | W | 70 nm | Al | 100 nm | 140 |
| Example 5-5 | W | 10 nm | SiO$_2$ | 80 nm | W | 60 nm | Al | 100 nm | 140 |
| Example 5-6 | W | 10 nm | SiO$_2$ | 80 nm | W | 40 nm | Al | 100 nm | 140 |
| Example 5-7 | W | 10 nm | SiO$_2$ | 80 nm | W | 30 nm | Al | 100 nm | 130 |
| Example 5-8 | W | 10 nm | SiO$_2$ | 80 nm | W | 20 nm | Al | 100 nm | 120 |
| Example 5-9 | W | 10 nm | SiO$_2$ | 80 nm | W | 10 nm | Al | 100 nm | 120 |
| Comparative Example 5-1 | — | 0 nm | — | 0 nm | W | 100 nm | Al | 100 nm | 80 |
| Comparative Example 5-2 | — | 0 nm | — | 0 nm | — | 0 nm | Al | 100 nm | 40 |

Table 6 shows that Examples 5-1 to 5-9 achieved higher contrast ratios than Comparative Examples 5-1 to 5-2. In Examples 5-1 to 5-9, the second metal layer included a stack including the metal layer C 113 and the metal layer D 114, i.e., had a stack structure including two or more kinds of metals.

Example 6-1

Figure 10:
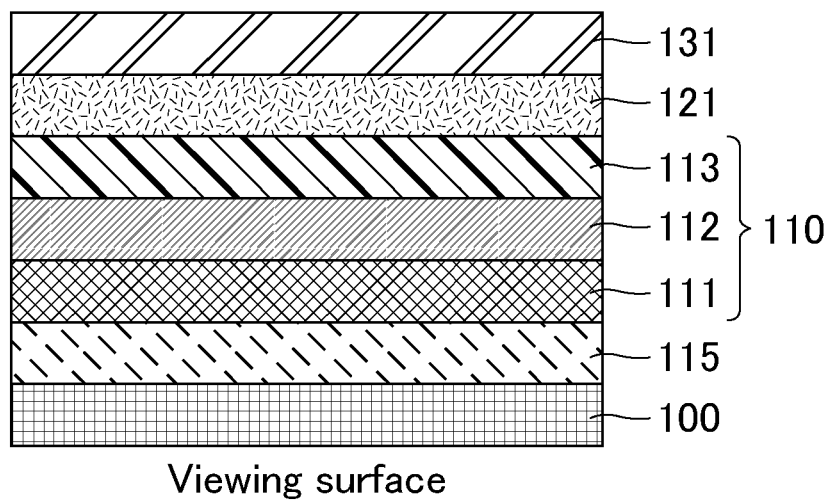
FIG. 10 is a schematic cross-sectional view showing the structure of a multilayer film in Example 6-1.

FIG. 10 is a schematic cross-sectional view showing the structure of a multilayer film of Example 6-1. In Example 6-1, a second transparent insulating layer (transparent insulating layer Z) 115, the first metal layer (metal layer A) 111, the first transparent insulating layer (transparent insulating layer B) 112, the second metal layer (metal layer C) 113, the insulating layer 121, the gate electrode 131, a gate insulating layer, a semiconductor layer, and a source-drain electrode were formed in the stated order on the glass substrate 100, whereby a TFT substrate was produced. Then, a liquid crystal display device was produced in the same manner as in Example 1-1, and the contrast ratio was calculated.

The multilayer film 110 of Example 6-1 consists of the second transparent insulating layer (transparent insulating layer Z) 115, the first metal layer (metal layer A) 111, the first transparent insulating layer (transparent insulating layer B) 112, and the second metal layer (metal layer C) 113. The multilayer film 110 and the TFT electrodes 130 of Example 6-1 had the same plane shapes as those shown in FIGS. 2 and 3. Table 7 shows the materials and the thicknesses of the second transparent insulating layer (transparent insulating layer Z) 115, the first metal layer (metal layer A) 111, the first transparent insulating layer (transparent insulating layer B) 112, and the second metal layer (metal layer C) 113.

Examples 6-2 to 6-10

Liquid crystal display devices were produced in the same manner as in Example 6-1 except that the second transparent insulating layer (transparent insulating layer Z) 115, the first metal layer (metal layer A) 111, the first transparent insulating layer (transparent insulating layer B) 112, and the second metal layer (metal layer C) 113 had different materials and thicknesses. Each device was determined for the contrast ratio. Table 7 shows the results.

TABLE 7

| | Transparent insulating layer Z | | Metal layer A | | Transparent insulating layer B | | Metal layer C | | |
|---|---|---|---|---|---|---|---|---|---|
| | Kind | Thickness | Kind | Thickness | Kind | Thickness | Kind | Thickness | CR |
| Example 6-8 | — | 0 nm | W | 10 nm | SiO$_2$ | 80 nm | W | 100 nm | 230 |
| Example 6-9 | SiNx | 10 nm | W | 10 nm | SiO$_2$ | 80 nm | W | 100 nm | 230 |
| Example 6-1 | SiNx | 15 nm | W | 10 nm | SiO$_2$ | 80 nm | W | 100 nm | 240 |
| Example 6-2 | SiNx | 30 nm | W | 10 nm | SiO$_2$ | 80 nm | W | 100 nm | 260 |
| Example 6-3 | SiNx | 50 nm | W | 10 nm | SiO$_2$ | 80 nm | W | 100 nm | 340 |
| Example 6-4 | SiNx | 70 nm | W | 10 nm | SiO$_2$ | 80 nm | W | 100 nm | 410 |
| Example 6-5 | SiNx | 100 nm | W | 10 nm | SiO$_2$ | 80 nm | W | 100 nm | 340 |
| Example 6-6 | SiNx | 120 nm | W | 10 nm | SiO$_2$ | 80 nm | W | 100 nm | 270 |
| Example 6-7 | SiNx | 135 nm | W | 10 nm | SiO$_2$ | 80 nm | W | 100 nm | 240 |
| Example 6-10 | SiNx | 140 nm | W | 10 nm | SiO$_2$ | 80 nm | W | 100 nm | 230 |

Table 7 shows that Examples 6-1 to 6-7, in which the second transparent insulating layer had a thickness of 15 nm or greater and 135 nm or smaller, achieved higher contrast ratios than Examples 6-8 to 6-10.

Example 7-1

Figure 11:
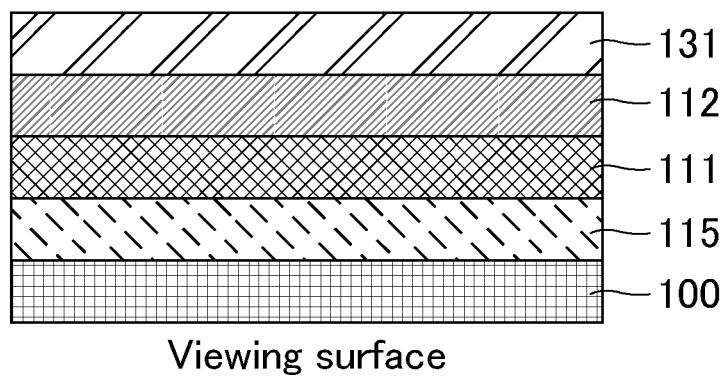
FIG. 11 is a schematic cross-sectional view showing the structure of a multilayer film in Example 7-1.
Figure 12:
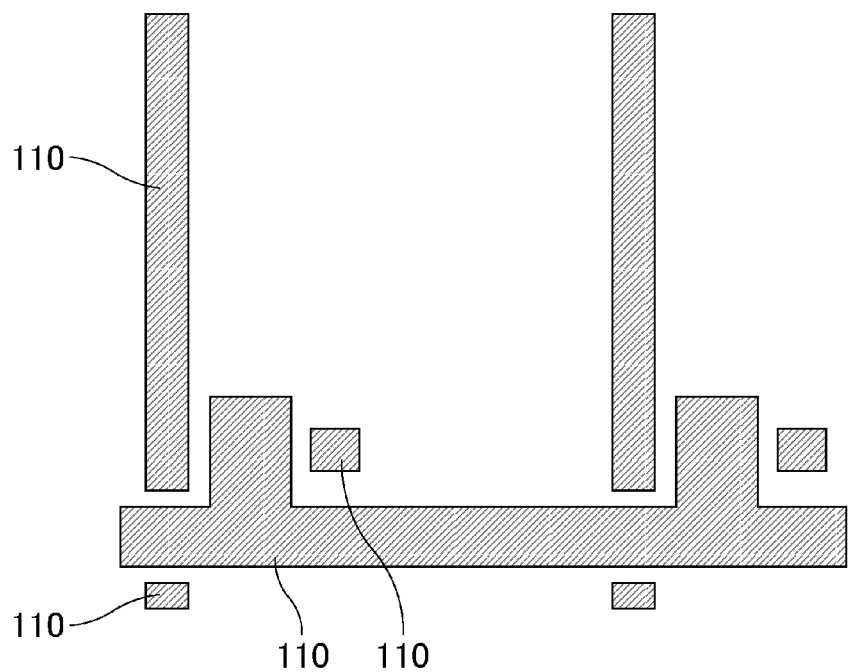
FIG. 12 is a schematic plan view showing the structure of the multilayer film 110 in Example 7-1.

FIG. 11 is a schematic cross-sectional view showing the structure of a multilayer film of Example 7-1. FIG. 12 is a schematic plan view showing the structure of the multilayer film 110 in Example 7-1. In Example 7-1, the second transparent insulating layer (transparent insulating layer Z) 115, the first metal layer (metal layer A) 111, the first transparent insulating layer (transparent insulating layer B)

112, the gate electrode 131, a gate insulating layer, a semiconductor layer, and a source-drain electrode were formed in the stated order on the glass substrate 100, whereby a TFT substrate was produced. Then, a liquid crystal display device was produced in the same manner as in Example 1-1, and the contrast ratio was calculated.

The multilayer film 110 of Example 7-1 consists of the second transparent insulating layer (transparent insulating layer Z) 115, the first metal layer (metal layer A) 111, the first transparent insulating layer (transparent insulating layer B) 112, and the gate electrode 131. Table 8 shows the materials and the thicknesses of the second transparent insulating layer (transparent insulating layer Z) 115, the first metal layer (metal layer A) 111, the first transparent insulating layer (transparent insulating layer B) 112, and the gate electrode 131.

The TFT electrodes 130 in Example 7-1 had the same plane shapes as those shown in FIG. 2. The plane shape of the multilayer film 110 in Example 7-1 is as shown in FIG. 12. A pattern of a tungsten layer constituting the gate electrode 131 was also disposed in a region superimposed with the source-drain electrode.

Examples 7-2 and 7-3

Liquid crystal display devices were produced in the same manner as in Example 7-1 except that the second transparent insulating layer (transparent insulating layer Z) 115, the first metal layer (metal layer A) 111, and the first transparent insulating layer (transparent insulating layer B) 112 had different materials and thicknesses. Each device was determined for the contrast ratio. Table 8 shows the results.

components such as a reflector 18 disposed on the back surface side of the light guide plate 17 and thereby can be incident on the liquid crystal panel. Accordingly, disposing the reflective layer 230 on the back surface side of the black matrix layer 220 achieves more efficient use of light to improve the transmittance.

The counter substrate in Example 8-1 was produced by the following method.

An aluminum reflection film was formed on the transparent substrate 200 using a sputtering apparatus. A positive resist was then applied to the reflection film. The reflection film with the positive resist was subjected to patterning by photolithography, whereby the reflective layer 230 was formed. A negative black resist was applied to the reflective layer 230 to form a light absorbing layer by photolithography, whereby the black matrix layer 220 was formed. Then, the color filter layer 210 and the overcoat layer were formed by photolithography.

Liquid crystals were added dropwise to the resulting counter substrate, and the counter substrate was bonded with a TFT substrate produced in the same manner as in Example 6-4. Then, a liquid crystal display device was produced in the same manner as in Example 6-4. The backlight had a reflectance of 50%. Table 9 shows the contrast ratio calculated.

Example 8-2

Figure 15:
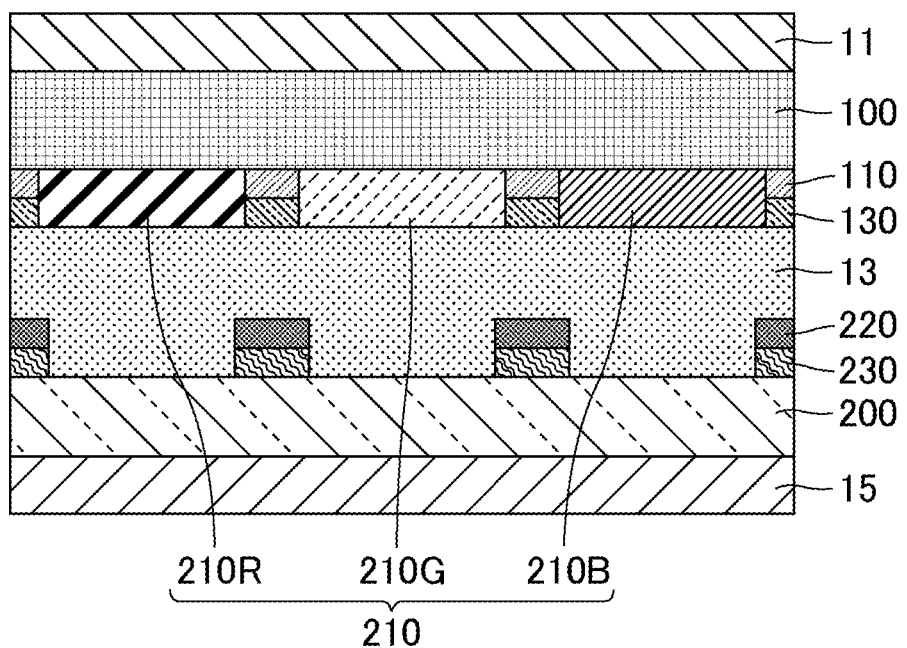
FIG. 15 is a schematic cross-sectional view showing the structure of a liquid crystal panel of Example 8-2.

FIG. 15 is a schematic cross-sectional view showing the structure of a liquid crystal panel of Example 8-2. The liquid crystal display device of Example 8-2 has the same structure

TABLE 8

| | Transparent insulating layer Z | | Metal layer A | | Transparent insulating layer B | | Gate electrode | | |
|---|---|---|---|---|---|---|---|---|---|
| | Kind | Thickness | Kind | Thickness | Kind | Thickness | Kind | Thickness | CR |
| Example 7-1 | — | 0 nm | Ti | 10 nm | SiO$_2$ | 80 nm | W | 200 nm | 390 |
| Example 7-2 | — | 0 nm | W | 10 nm | SiO$_2$ | 80 nm | W | 200 nm | 230 |
| Example 7-3 | SiN$x$ | 70 nm | W | 10 nm | SiO$_2$ | 80 nm | W | 200 nm | 410 |

Example 8-1

Figure 13:
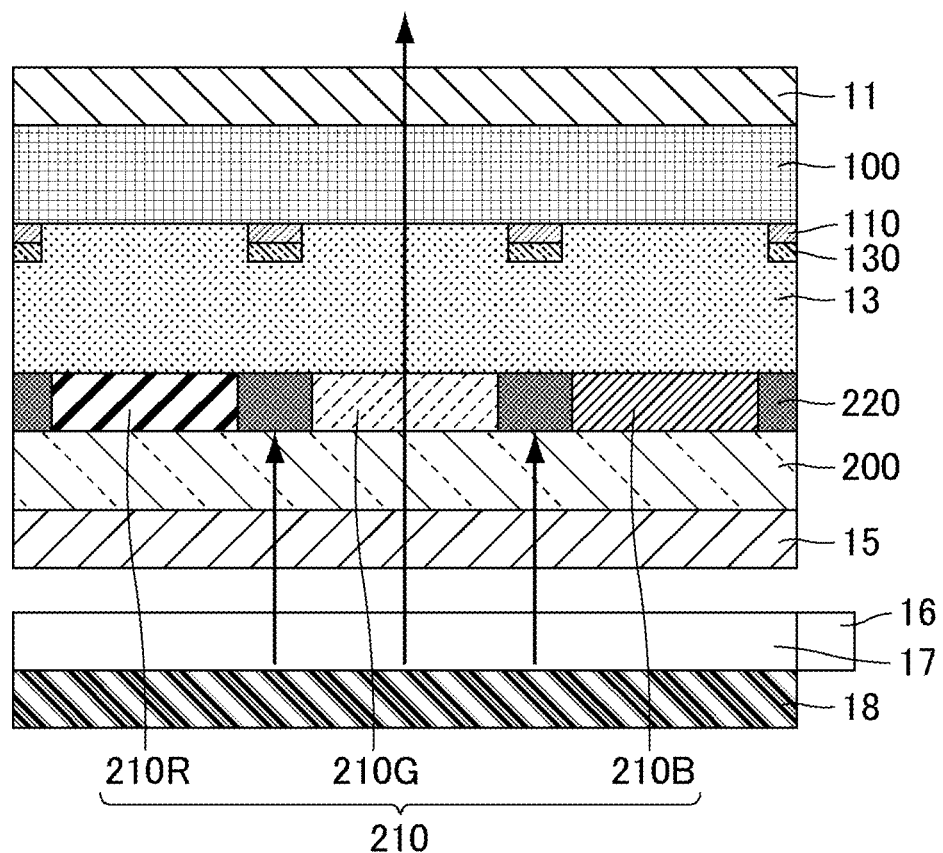
FIG. 13 is a schematic cross-sectional view showing the structure of a liquid crystal display device of Example 6-4.
Figure 14:
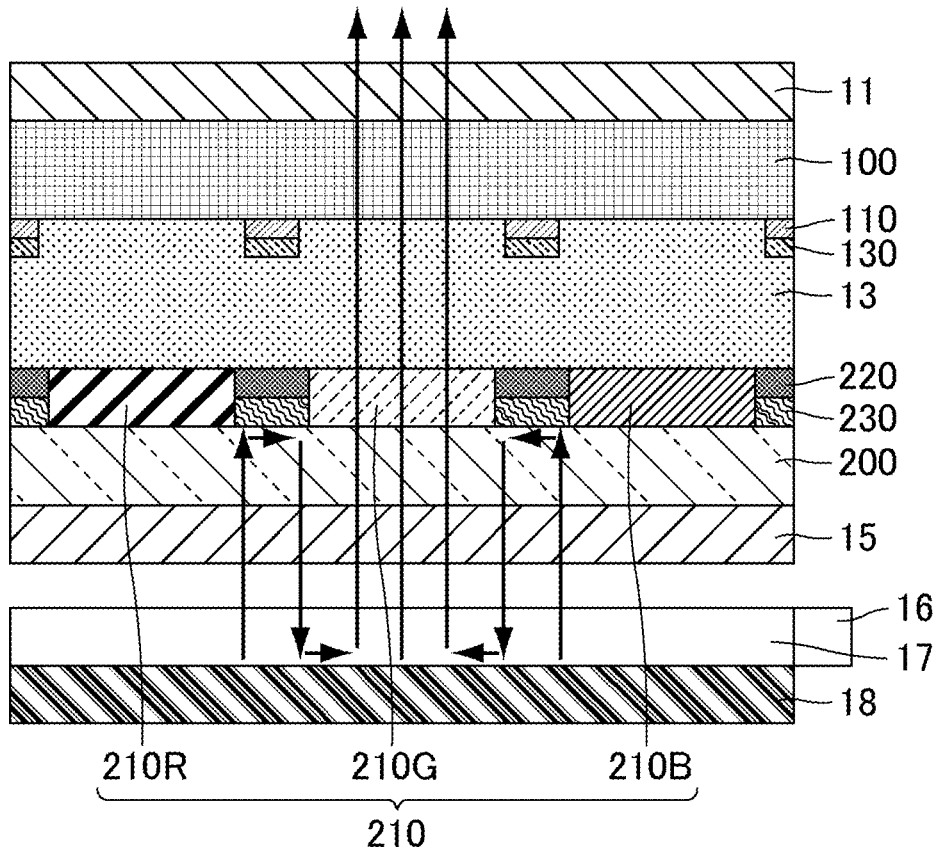
FIG. 14 is a schematic cross-sectional view showing the structure of a liquid crystal display device of Example 8-1.

FIG. 13 is a schematic cross-sectional view showing the structure of a liquid crystal display device of Example 6-4. FIG. 14 is a schematic cross-sectional view showing the structure of a liquid crystal display device of Example 8-1. The liquid crystal display device of Example 8-1 has the same structure as the liquid crystal display device of Example 6-4 except that the counter substrate is provided with a reflective layer 230.

As shown in FIGS. 13 and 14, each liquid crystal panel includes on the back surface side thereof a backlight. Light emitted from an edge light 16 is incident on the liquid crystal panel through a light guide plate 17. In the liquid crystal display device of Example 6-4 shown in FIG. 13, part of the light incident on the liquid crystal panel is absorbed by the black matrix layer 220. Meanwhile, in the liquid crystal display device of Example 8-1 shown in FIG. 14, the black matrix layer 220 includes on the back surface side thereof the reflective layer 230. Thus, part of the light incident on the liquid crystal panel is not absorbed by the black matrix layer 220 but reflected by the reflective layer 230. The light reflected by the reflective layer 230 is reflected again by as the liquid crystal display device of Example 6-4 except for the following points. Table 9 shows the contrast ratio calculated.

The TFT substrate included the color filter layer 210 formed by photolithography.

The counter substrate included not the color filter layer 210 but the reflective layer 230.

The counter substrate in Example 8-2 was produced by the following method.

An aluminum reflection film was formed on the transparent substrate 200 using a sputtering apparatus. A positive resist was then applied to the reflection film. The reflection film with the positive resist was subjected to patterning by photolithography, whereby the reflective layer 230 was formed in a region corresponding to the region with the black matrix between the color filters in the counter substrate in Example 6-4. A negative black resist was applied to the reflective layer 230 to form a light absorbing layer by photolithography, whereby the black matrix layer 220 was formed. Then, the color filter layer 210 and the overcoat layer were formed by photolithography.

Example 8-3

Figure 16:
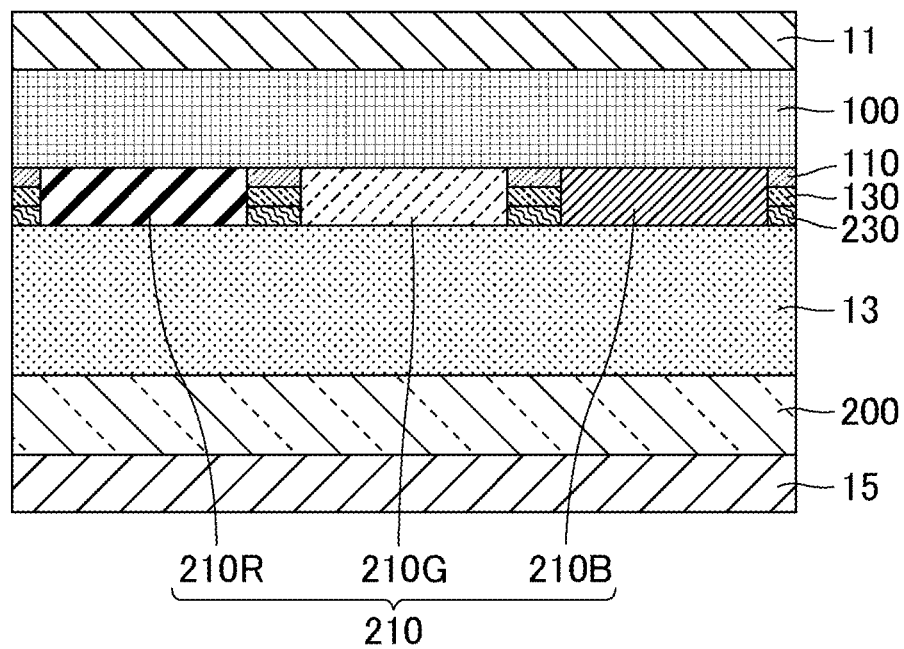
FIG. 16 is a schematic cross-sectional view showing the structure of a liquid crystal panel of Example 8-3.

FIG. 16 is a schematic cross-sectional view showing the structure of a liquid crystal panel of Example 8-3. The liquid crystal display device of Example 8-3 has the same structure as the liquid crystal display device of Example 6-4 except for the following points. Table 9 shows the contrast ratio calculated.

The TFT substrate included the color filter layer 210 formed by photolithography.

The TFT substrate included the reflective layer 230 formed by patterning an aluminum reflection film in each of the regions including the gate electrode, the source electrode, the drain electrode, and the semiconductor layer.

The counter substrate did not include the color filter layer 210 and the black matrix layer 220.

Example 8-4

Figure 17:
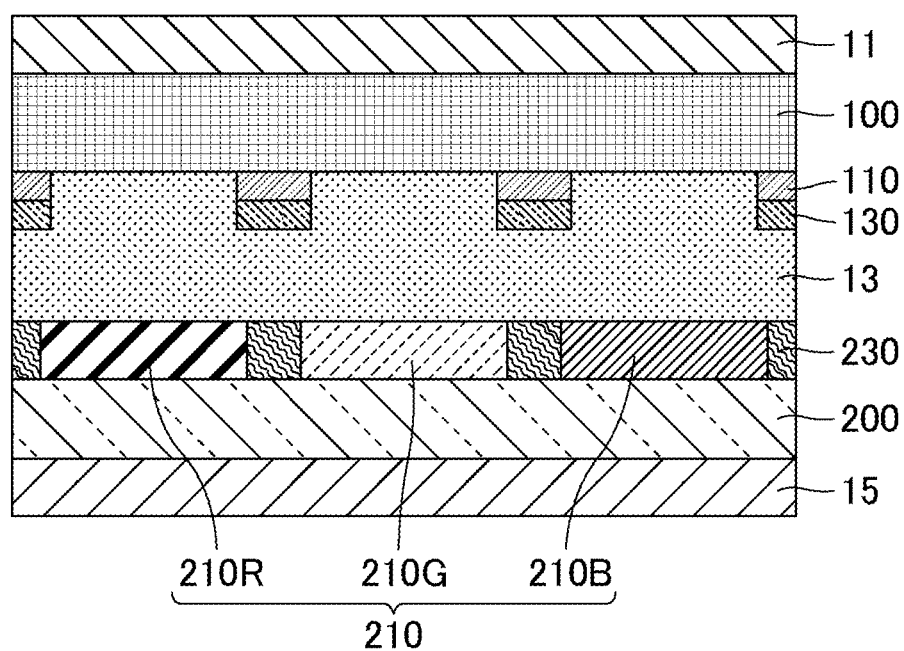
FIG. 17 is a schematic cross-sectional view showing the structure of a liquid crystal panel of Example 8-4.

FIG. 17 is a schematic cross-sectional view showing the structure of a liquid crystal panel of Example 8-4. The liquid crystal display device of Example 8-4 has the same structure as the liquid crystal display device of Example 6-4 except for the following points. Table 9 shows the contrast ratio calculated.

In the TFT substrate, the widths of the gate line and the source line were increased to the same width of the black matrix layer 220 in the counter substrate in Example 1-1.

The counter substrate included not the black matrix layer 220 but the reflective layer 230.

The counter substrate in Example 8-4 was produced by the following method.

An aluminum reflection film was formed on the transparent substrate 200 using a sputtering apparatus. A positive resist was then applied to the reflection film. The reflection film with the positive resist was subjected to patterning by photolithography, whereby the reflective layer 230 was formed. The reflective layer 230 of Example 8-4 had an area smaller than each area of the gate electrode, the source electrode, and the drain electrode on the TFT substrate side and the patterned shape of the reflective layer 230 was invisible to a viewer. Then, the color filter layer 210 and the overcoat layer were formed by photolithography.

Example 8-5

Figure 18:
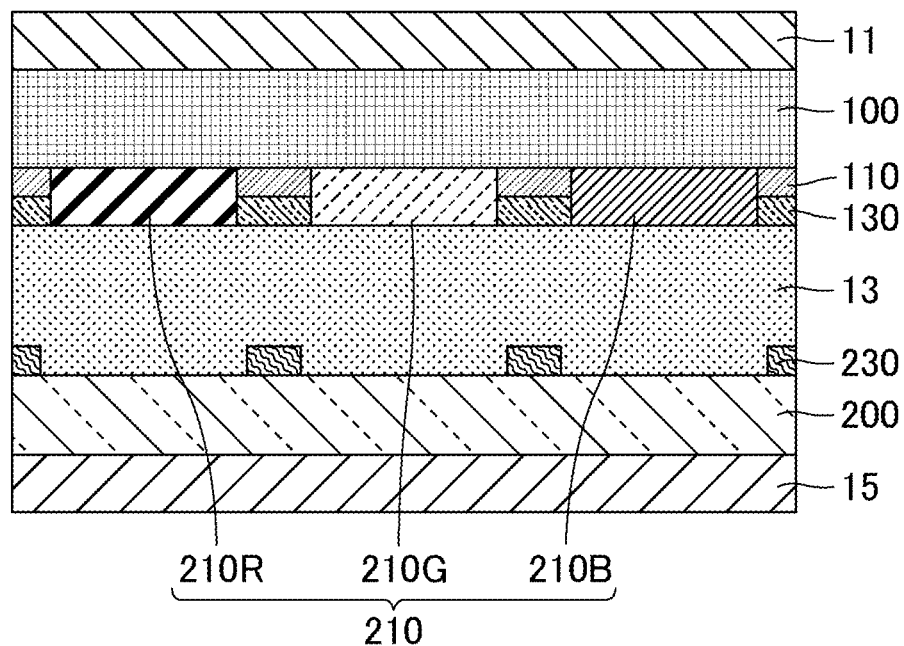
FIG. 18 is a schematic cross-sectional view showing the structure of a liquid crystal panel of Example 8-5.

FIG. 18 is a schematic cross-sectional view showing the structure of a liquid crystal panel of Example 8-5. The liquid crystal display device of Example 8-5 has the same structure as the liquid crystal display device of Example 6-4 except for the following points. Table 9 shows the contrast ratio calculated.

In the TFT substrate, the widths of the gate line and the source line were increased to the same width of the black matrix layer 220 in the counter substrate in Example 1-1.

The TFT substrate included the color filter layer 210 formed by photolithography.

The counter substrate included not the color filter layer 210 and the black matrix layer 220 but the reflective layer 230.

The counter substrate in Example 8-5 was produced by the following method.

An aluminum reflection film was formed on the transparent substrate 200 using a sputtering apparatus. A positive resist was then applied to the reflection film. The reflection film with the positive resist was subjected to patterning by photolithography, whereby the reflective layer 230 was formed. The reflective layer 230 of Example 8-5 had an area smaller than the area of the gate electrode, the source electrode, and the drain electrode on the TFT substrate side and the patterned shape of the reflective layer 230 was invisible to a viewer. Then, the overcoat layer was formed by photolithography.

Example 8-6

Figure 19:
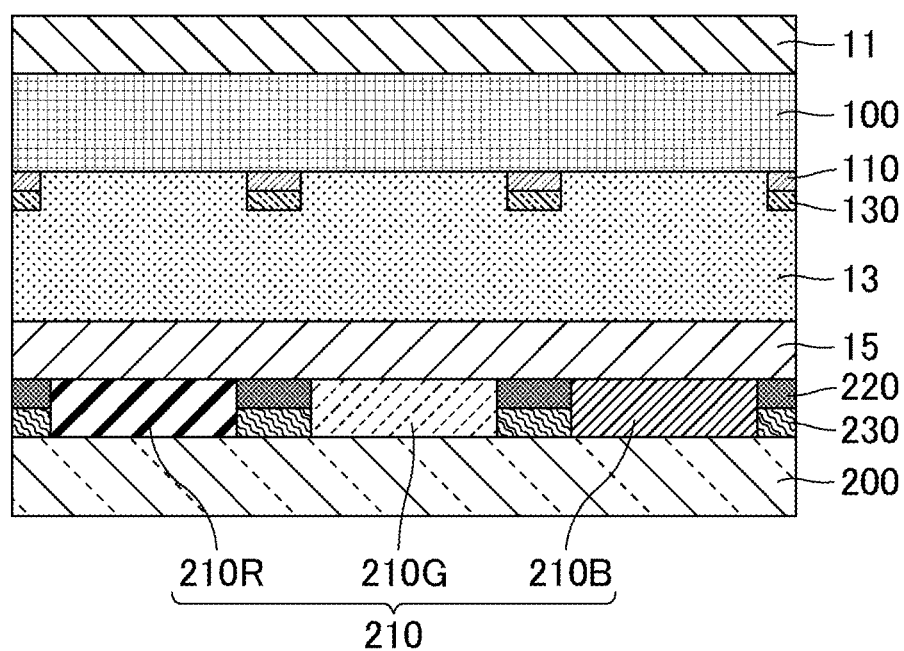
FIG. 19 is a schematic cross-sectional view showing the structure of a liquid crystal panel of Example 8-6.

FIG. 19 is a schematic cross-sectional view showing the structure of a liquid crystal panel of Example 8-6. The liquid crystal display device of Example 8-6 has the same structure as the liquid crystal display device of Example 8-1 except for the following points. Table 9 shows the contrast ratio calculated.

In the counter substrate, no polarizing plate was disposed on the backlight side, and the first polarizing plate 15 formed from a lyotropic polarizer layer was disposed on the liquid crystal layer side of the overcoat layer.

TABLE 9

|  | CR |
| --- | --- |
| Example 8-1 | 490 |
| Example 8-2 | 490 |
| Example 8-3 | 610 |
| Example 8-4 | 470 |
| Example 8-5 | 470 |
| Example 8-6 | 530 |
| Example 6-4 | 410 |

Table 9 shows that Examples 8-1 to 8-6, in which a reflective layer was disposed, achieved higher contrast ratios than Example 6-4. In particular, Example 8-3, in which the color filter layer 210 and the reflective layer 230 were disposed on the TFT substrate side, had a design with a higher aperture ratio than the other examples, which achieved the highest transmittance and thus the highest contrast ratio.

Figure 20:
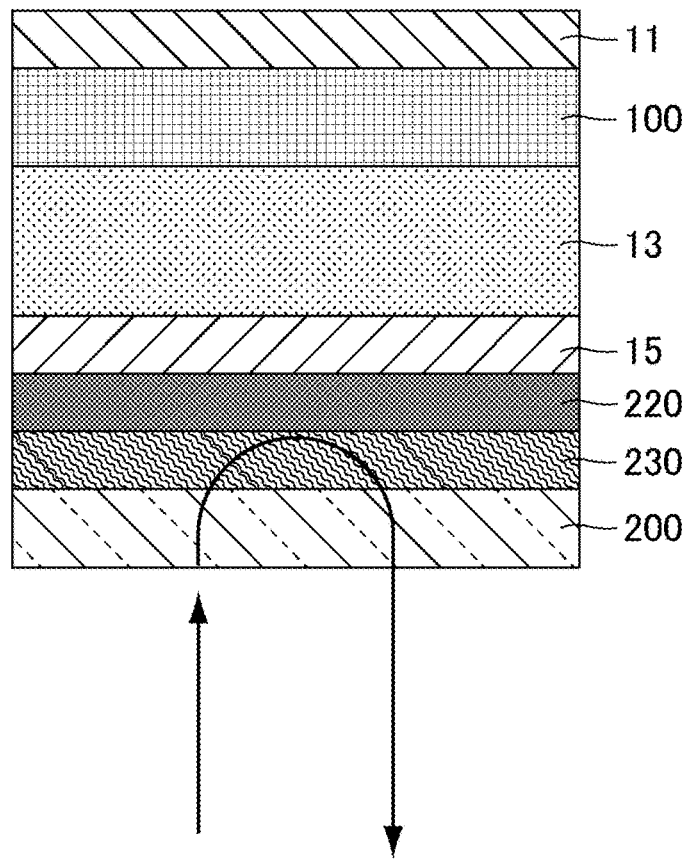
FIG. 20 is a schematic view showing an optical path of light reflected by a reflective layer 230 in Example 8-6.
Figure 21:
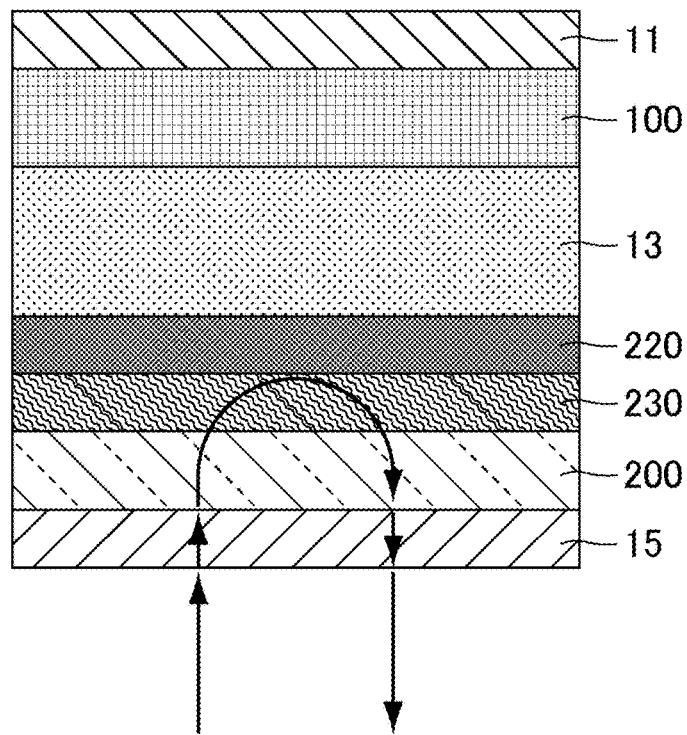
FIG. 21 is a schematic view showing an optical path of light reflected by the reflective layer 230 in Example 8-1.

Example 8-6, in which the first polarizing plate 15 was disposed closer to the viewing surface than the reflective layer 230 was, achieved more efficient use of light, resulting in a higher contrast ratio than Example 8-1. FIG. 20 is a schematic view showing an optical path of light reflected by the reflective layer 230 in Example 8-6. FIG. 21 is a schematic view showing an optical path of light reflected by the reflective layer 230 in Example 8-1. FIG. 20 and FIG. 21 show that light reflected by the reflective layer 230 passes through the first polarizing plate 15 twice in Example 8-1 but no light reflected by the reflective layer 230 passes through the first polarizing plate 15 in Example 8-6. Accordingly, in Example 8-6, the light reflected by the reflective layer 230 is not absorbed by the first polarizing plate 15 and is thus not attenuated, which achieves more efficient use of light.

Comparative Examples 9-1 to 9-3

Liquid crystal display devices were produced in the same manner as in Example 6-1 except that the second transparent insulating layer (transparent insulating layer Z) 115, the first metal layer (metal layer A) 111, the first transparent insulating layer (transparent insulating layer B) 112, and the second metal layer (metal layer C) 113 had different materials and thicknesses. Each device was determined for the contrast ratio. Table 10 shows the results.

TABLE 10

| | Transparent insulating layer Z | | Metal layer A | | Transparent insulating layer B | | Metal layer C | | |
|---|---|---|---|---|---|---|---|---|---|
| | Kind | Thickness | Kind | Thickness | Kind | Thickness | Kind | Thickness | CR |
| Comparative Example 9-1 | — | 0 nm | — | 0 nm | — | 0 nm | W | 100 nm | 80 |
| Comparative Example 9-2 | — | 0 nm | — | 0 nm | — | 0 nm | Al | 100 nm | 40 |
| Comparative Example 9-3 | SiNx | 70 nm | Al | 10 nm | SiO$_2$ | 80 nm | Al | 100 nm | 50 |

Table 10 shows that Comparative Examples 9-1 to 9-3 all caused low contrast ratios. Comparative Example 9-3, in which the first metal layer (metal layer A) 111 and the second metal layer (metal layer C) 113 were both formed from aluminum (Al) having a reflectance at a thickness of 200 nm of 88%, failed to achieve a sufficient antireflection effect by the multilayer film, resulting in a low contrast ratio.

Figure 22:
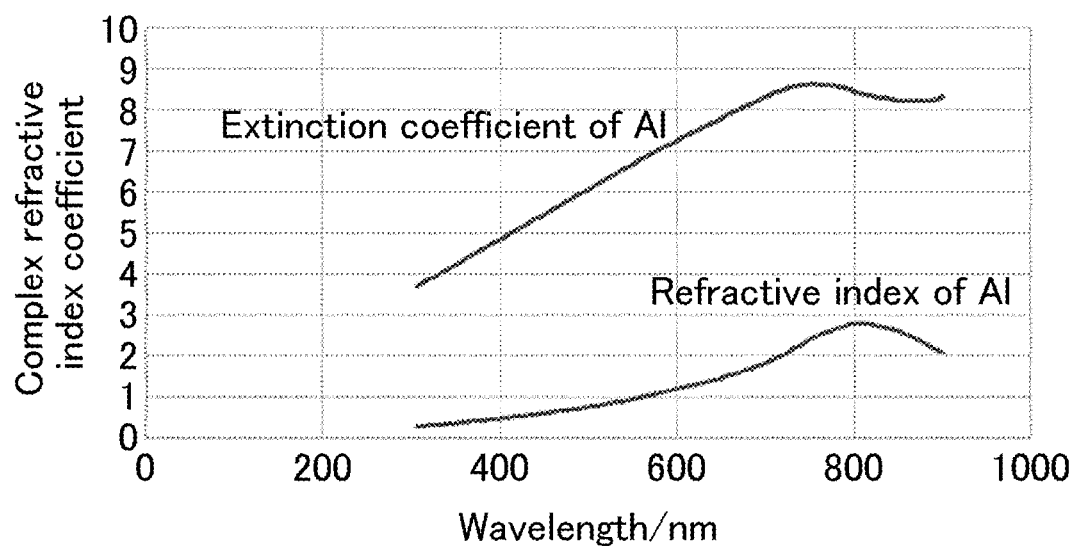
FIG. 22 is a graph showing the wavelength dependence of the complex refractive index of aluminum (Al).

FIG. 22 is a graph showing the wavelength dependence of the complex refractive index of aluminum (Al). FIG. 22 shows that the metal layer formed from Al, in which the real part (refractive index) and the imaginary part (extinction coefficient) of the complex refractive index show the same tendency against the wavelength dependence but their inclinations in the graph are different, could not allow the multilayer film to achieve a sufficient antireflection effect.

What is claimed is:

1. A display panel comprising on a viewing surface side thereof a thin film transistor substrate, the thin film transistor substrate comprising:
    thin film transistor electrodes including a gate electrode, a source electrode, and a drain electrode; and
    a multilayer film including a stack including, in the order from the viewing surface side, a first metal layer having a thickness of 40 nm or smaller, a first transparent insulating layer having a thickness of 10 nm or greater and 155 nm or smaller, and a second metal layer having a greater thickness than the first metal layer,
    the multilayer film including a layer formed from a metal having a reflectance at a thickness of 200 nm of 50% or lower, and
    the multilayer film overlaps at least one of the gate electrode, the source electrode, and the drain electrode in a plan view, and is closer to the viewing surface than the gate electrode, the source electrode, and the drain electrode are in a sectional view.

2. The display panel according to claim 1,
    wherein the thin film transistor substrate includes an insulating layer between the at least one electrode of the thin film transistor electrodes and the multilayer film.

3. The display panel according to claim 1,
    wherein the first metal layer contains tungsten or titanium.

4. The display panel according to claim 1,
    wherein the first transparent insulating layer contains silicon dioxide.

5. The display panel according to claim 1,
    wherein the second metal layer contains tungsten or titanium.

6. The display panel according to claim 1,
    wherein the first metal layer and the second metal layer contain the same material.

7. The display panel according to claim 1,
    wherein the display panel includes multiple color filters arranged in a plane and a reflective layer disposed between the color filters.

8. The display panel according to claim 7,
    wherein the display panel includes a first polarizing plate disposed closer to the viewing surface than the reflective layer is, a liquid crystal layer disposed closer to the viewing surface than the first polarizing plate is, and a second polarizing plate disposed closer to the viewing surface than the liquid crystal layer is.

9. A display panel comprising on a viewing surface side thereof a thin film transistor substrate,
    the thin film transistor substrate comprising a multilayer film in a region in a plan view including at least one electrode of thin film transistor electrodes including a gate electrode, a source electrode, and a drain electrode,
    the multilayer film including a stack including, in the order from the viewing surface side, a first metal layer having a thickness of 40 nm or smaller, a first transparent insulating layer having a thickness of 10 nm or greater and 155 nm or smaller, and a second metal layer having a greater thickness than the first metal layer,
    the multilayer film including a layer formed from a metal having a reflectance at a thickness of 200 nm of 50% or lower,
    wherein the thin film transistor substrate includes a second transparent insulating layer disposed closer to the viewing surface than the first metal layer is.

10. The display panel according to claim 9,
    wherein the second transparent insulating layer contains silicon nitride.

11. The display panel according to claim 9,
    wherein the multilayer film is disposed closer to the viewing surface than the at least one electrode of the thin film transistor electrodes is, and
    the thin film transistor substrate includes an insulating layer between the at least one electrode of the thin film transistor electrodes and the multilayer film.

12. The display panel according to claim 9,
    wherein the second metal layer corresponds to one of the thin film transistor electrodes disposed closest to the viewing surface.

13. The display panel according to claim 12,
    wherein the second metal layer is disposed in a region including an electrode of the thin film transistor electrodes other than the at least one electrode and is not electrically in contact with the electrode other than the at least one electrode.

14. The display panel according to claim 9,
    wherein the first metal layer contains tungsten or titanium.

15. The display panel according to claim 9,
    wherein the first transparent insulating layer contains silicon dioxide.

16. The display panel according to claim 9,
wherein the second metal layer contains tungsten or titanium.
17. The display panel according to claim 9,
wherein the first metal layer and the second metal layer contain the same material.
18. The display panel according to claim 9,
wherein the display panel includes multiple color filters arranged in a plane and a reflective layer disposed between the color filters.
19. The display panel according to claim 18,
wherein the display panel includes a first polarizing plate disposed closer to the viewing surface than the reflective layer is, a liquid crystal layer disposed closer to the viewing surface than the first polarizing plate is, and a second polarizing plate disposed closer to the viewing surface than the liquid crystal layer is.
20. The display panel according to claim 9,
wherein the multilayer film is disposed so as to be closer to the viewing surface than the gate electrode, the source electrode, and the drain electrode are in a section view.

\* \* \* \* \*